Aug. 19, 1969 E. O. GILBERT 3,462,697

STABILIZED AMPLIFIER HAVING IMPROVED OVERLOAD RECOVERY

Filed July 9, 1965 4 Sheets-Sheet 1

INVENTOR.
EDWARD O. GILBERT
BY Richard D. Stephens

STABILIZED AMPLIFIER HAVING IMPROVED OVERLOAD RECOVERY

Filed July 9, 1965 4 Sheets-Sheet 2

INVENTOR.
EDWARD O. GILBERT
BY
Richard D. Stephens

Aug. 19, 1969 E. O. GILBERT 3,462,697

STABILIZED AMPLIFIER HAVING IMPROVED OVERLOAD RECOVERY

Filed July 9, 1965 4 Sheets-Sheet 3

INVENTOR.
EDWARD O. GILBERT
BY

*INVENTOR.*
EDWARD O. GILBERT
BY

United States Patent Office 3,462,697

Patented Aug. 19, 1969

3,462,697
STABILIZED AMPLIFIER HAVING IMPROVED OVERLOAD RECOVERY

Edward O. Gilbert, Ann Arbor, Mich., assignor to Applied Dynamics, Inc., Ann Arbor, Mich., a corporation of Michigan Filed July 9, 1965, Ser. No. 471,790
Int. Cl. H03f 1/02
U.S. Cl. 330—9 8 Claims

ABSTRACT OF THE DISCLOSURE

A drift-stabilized dual-channel operational amplifier in which amplifier overload is detected to provide a switching signal which switches the amplifier to an oscillatory condition whereby it may rapidly drive itself out of the overload condition upon removal of the overload. A differential amplifier includes voltage-follower field-effect transistor input stages and a pair of opposite-polarity supply voltages for the differential stage are provided using an inverting amplifier so that supply fluctuations tend not to increase offset. A totem-pole output stage is provided with current-limiting which varies inversely with voltage across the output stage transistors. The system power ground and signal ground busses are interconnected through a low-pass filter.

This invention relates to electronic computer circuits, and more particularly, to a novel feedback operational amplifier incorporating an improved system for removing the effects of overloads in electronic analog computing systems.

Modern electronic analog computer systems generally comprise a plurality of stabilized feedback operational amplifiers which are interconnected with various other computing circuits, such as multipliers, function generators, switches and the like, into complex multiloop circuits with the interconnections utilized during the solution of a given problem depending upon the nature of the equation to be solved.

Stabilized operational amplifiers conventionally comprise direct-coupled high-frequency stages for amplifying signal components above zero frequency, and a stabilizer channel to amplify zero frequency and some low frequency components. As is well known, such dual-channel amplifiers combine the superior high frequency response of the direct-coupled amplifier channel and the drift-minimizing advantage of the modulated-carrier RC-coupled stages of the stabilizer channel. Because many problems requiring solution defy ready analysis, computer scaling frequently must be done by trial and error. Selection of large scale factors degrades computer accuracy, but selection of scale factors which are too small frequently results in one or more amplifier circuits being driven into an overload condition. The overload of a stabilized operational amplifier conventionally has been indicated in the prior art by means of an overload indicator lamp which becomes illuminated when its associated amplifier overloads. Because a large number of amplifiers are sometimes interconnected, an overload occurring in one amplifier circuit may quickly overdrive other amplifier circuits, and often it is difficult for an operator to tell which amplifier overloaded first in order to know which computer circuit needs rescaling. If a typical amplifier is driven very far into an overload condition, a number of fairly large capacitors may become charged to fairly high voltage levels, and due to the necessarily long time-constants of the circuits involving such capacitors, a long recovery time is required before such capacitors discharge and the amplifier can resume normal operation.

One obvious method of limiting the effects of an overvoltage condition at any point in a computer, or in any circuit for that matter, is to use ordinary shunt diode limiters, and the recovery time after overloading frequently has been lessened in that manner in the prior art. However, such a technique is disadvantageous, not only because it requires a pair of diodes at every long time-constant circuit, but also because oppositely poled diodes connected in parallel with a capacitor inherently cannot fully discharge the capacitor, since such diodes require, in order that the amplifiers be capable of normal operation, a control potential or threshold forward voltage below which they do not conduct. In typical silicon diodes the threshold potential is of the order of 500 millivolts, and thus while oppositely poled diodes prevent the capacitors from charging up above .5 volt, they leave a charge of .5 volt on the capacitors when the fault causing the overload is removed, and a considerable recovery time still may be required before the .5 volt charge dissipates and accurate computation can resume. In typical prior art amplifiers using shunt diode limiters, recovery times of 4 or 5 seconds are typical before accurate computation can be resumed, and a further disadvantage of such arrangements is that very inaccurate computation may occur during such a 4 or 5 second recovery time due to the .5 volt charges left on the capacitors.

The present invention, rather than utilizing simple diode limiting at each long time-constant circuit, operates upon occurrence of an overload in an amplifier, to modify the characteristics of the amplifier so that the amplifier drives itself out of the overload condition as soon as the "fault" which caused the overload is removed. In accordance with the present invention, the occurrence of an overload is immediately sensed and used to switch the amplifier into a circuit configuration which is unstable, or oscillatory. The amplifier, as soon as the fault is corrected, begins to oscillate. Oscillation automatically drives each and every portion of the amplifier signal channels in alternating directions, quickly reducing the voltages in all long time-constant circuits to low values within or near their normal operating levels. After a predetermined period of oscillation, the amplifier is switched back to its normal configuration, and it is ready then to resume normal operation. In the invention, capacitors which are overcharged by an overload are rapidly driven down to charges of perhaps 50 millivolts in less than one second after an overload is removed, and then in about two more seconds the remaining charge is substantially completely removed.

In order to properly operate the overload recovery system of the invention, derivation of an overload signal extremely rapidly upon occurrence of an overload is necessary. Such an overload signal is also very useful for computer mode switching and logic control, and ideally such an overload signal is of an "absolute value" type, i.e., it has the same sign irrespective of whether the amplifier overload is in the positive direction or the negative direction.

Accurate computation with a dual channel operational amplifier requires accurate comparison of an input signal and a low-frequency or drift-correction signal, and differential amplifiers are usually used for such a purpose. Error in amplifier operation is especially harmful in the differential first stage of an amplifier. The invention incorporates a novel differential amplifier which is powered in a unique manner to minimize the effects of power supply variations on computer accuracy. Further, the amplifier includes a noval balancing control which adjusts the current in a long time-constant circuit rather than causing step voltage charges, thereby obviating undesirable oscillations which sometimes attended balancing of prior art computer amplifiers.

The invention also incorporates an output stage which draws little idle current yet allows very substantial load currents to be drawn wtih output voltages of both polarities. A novel current-limiting circuit feature makes the use of fuses absolutely unnecessary to protect the amplifier output stage, even if the output terminal is accidentally patched to a power supply terminal. Though sufficiently rapidly acting to prevent amplifier damage under such conditions, the current limiting arrangement will still allow peak currents for short intervals so that substantial capacitive loads may be charged effectively. To utilize an increased amount of the permissible operating area of the amplifier power transistors, the current levels at which limiting of the current through a power transistor begins are made to vary automatically as a function of the voltage across each power transistor as well as the current through each power transistor.

By connecting the amplifier to signal ground and to power ground with an intervening low-pass filter, considerable reduction is accomplished of the noise heretofore found in large computers having long signal ground and power ground busses.

Thus it is a primary object of the present invention to provide an improved analog computer amplifier overload control system.

It is a more specific object of the invention to provide a novel stabilized operational amplifier system which automatically drives itself out of overload conditions.

It is another object of the invention to provide an operational amplifier system which oscillates upon the occurrence of an overload to reduce the voltage levels in its long time-constant circuits.

Further objects are to provide a rapid absolute value type of overload signal, to provide an improved differential amplifier stage for a stabilized operational amplifier which is insensitive to power supply fluctuations, to provide a stabilized amplifier which may be balanced easily and quickly without causing stabilizer loop oscillation, to provide an amplifier which is protected against damage from gross patching errors without the use of fuses, but which can supply large peak currents suitable for driving capacitive loads, and to provide an amplifier system in which each connection to signal ground is through a low-pass filter to reduce the effects of noise present in long power ground and signal ground busses.

Other objects of the invention will in part be obvious and will in part appear hereinafter.

The invention accordingly comprises the features of construction combinations of elements, and arrangement of parts, which will be exemplified in the constructions hereinafter set forth, and the scope of the invention will be indicated in the claims.

For a fuller understanding of the nature of objects of the invention reference should be had to the following details description taken in connection with the accompanying drawings, in which.

Figures 1, 2A:
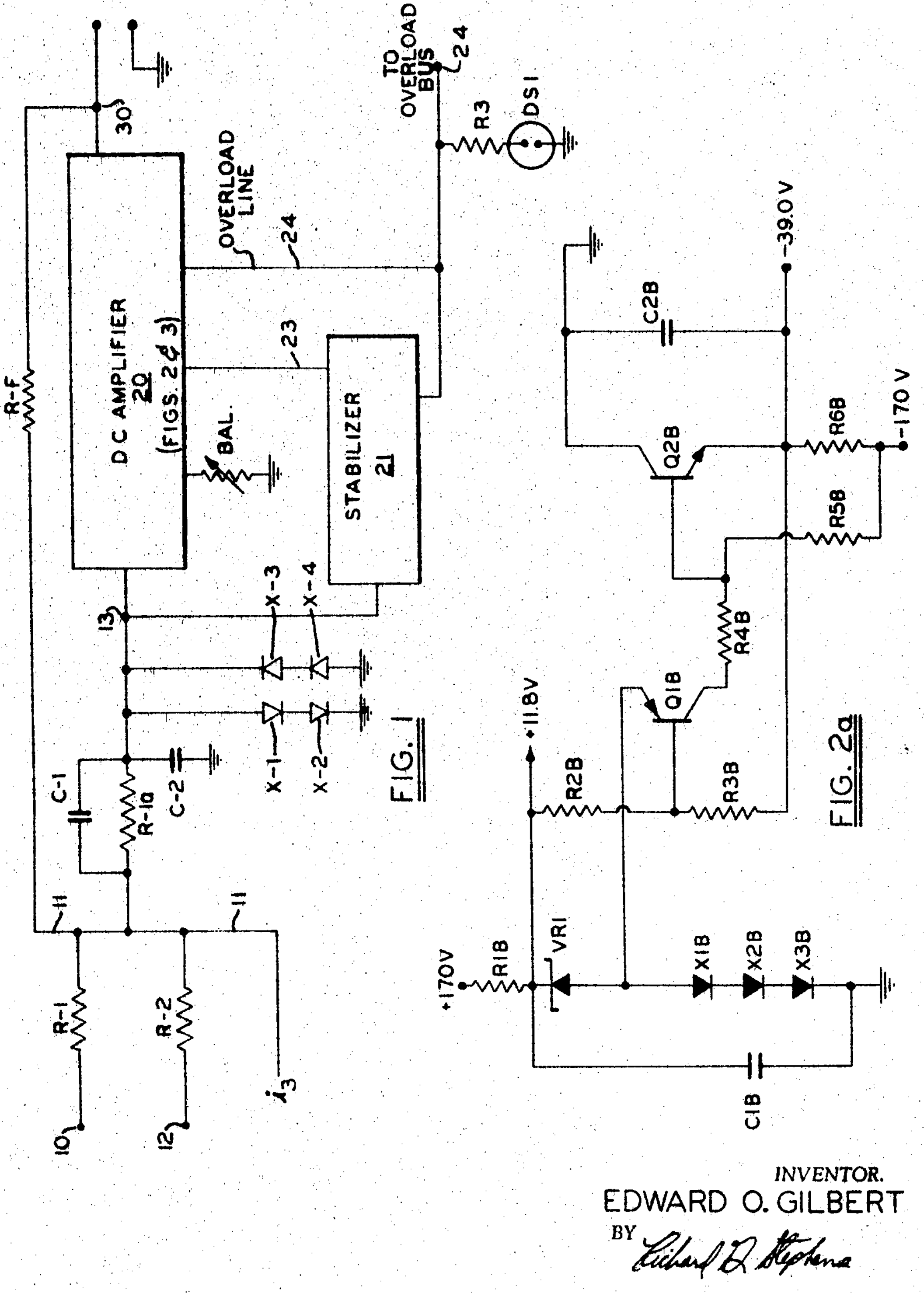
FIG. 1 is a schematic diagram, partially in block form, of one form of stabilized operational amplifier constructed according to the invention.
Figure 2:
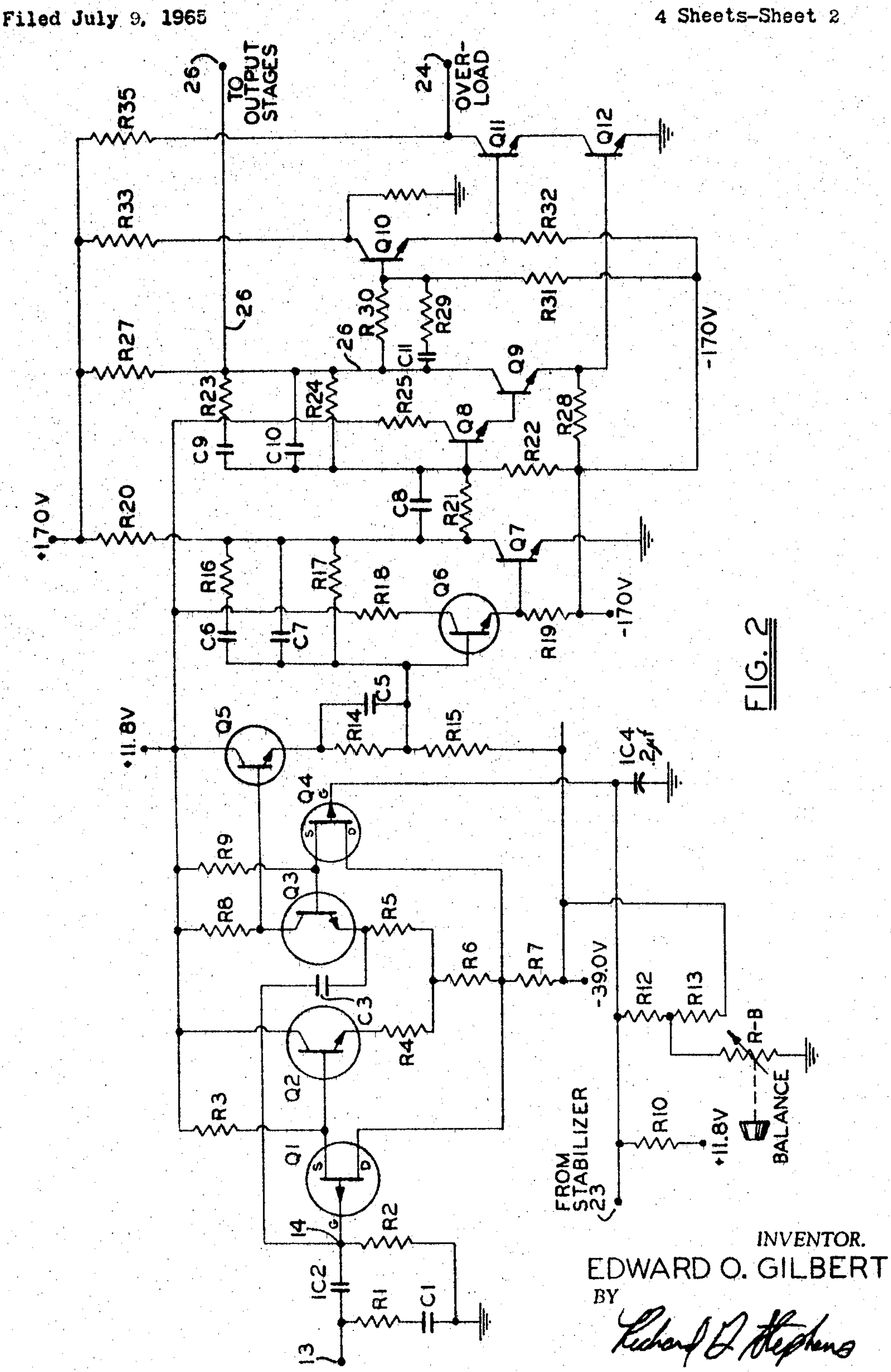
FIG. 2 is an electrical schematic showing the preamplifier portion of the high-frequency amplifier channel 20 of FIG. 1.
Figure 3:
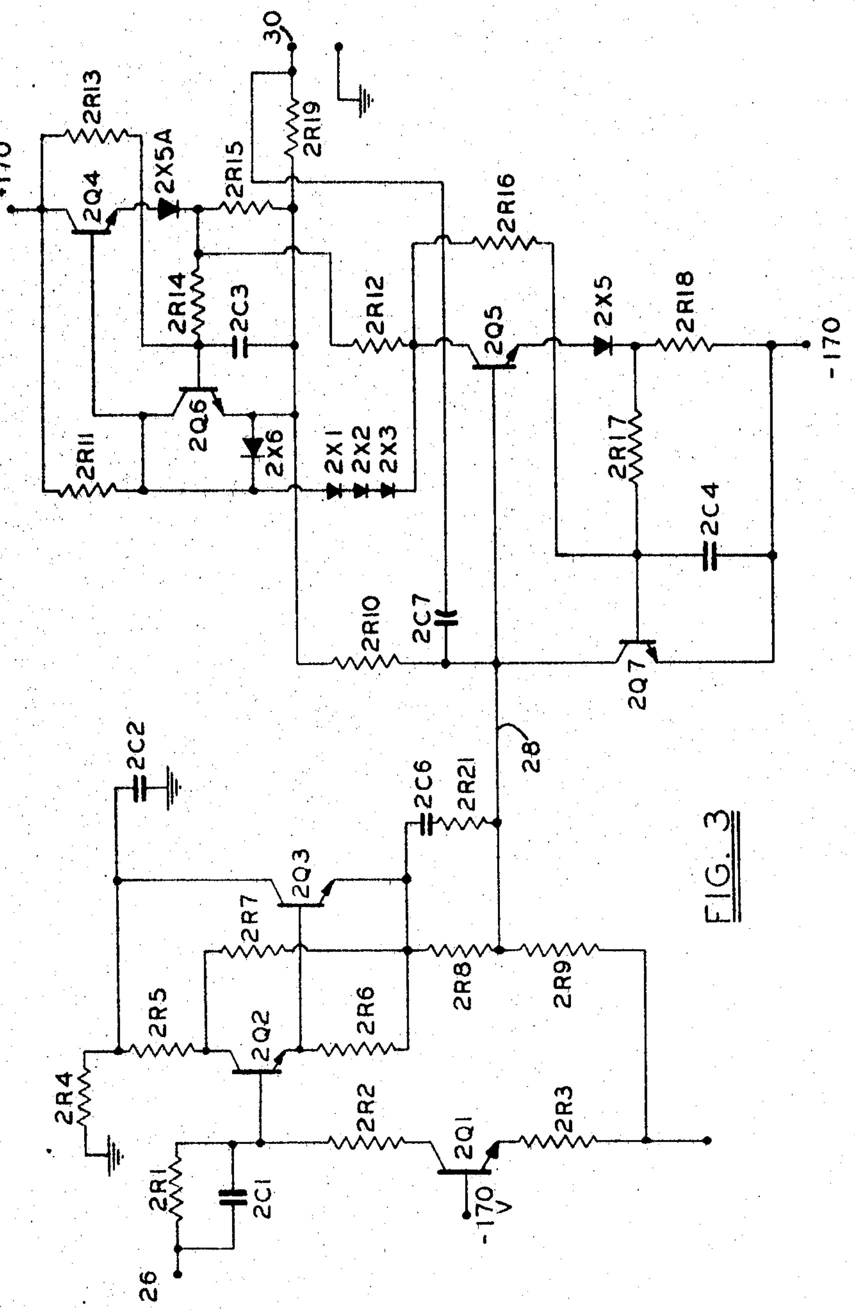
Figure 4:
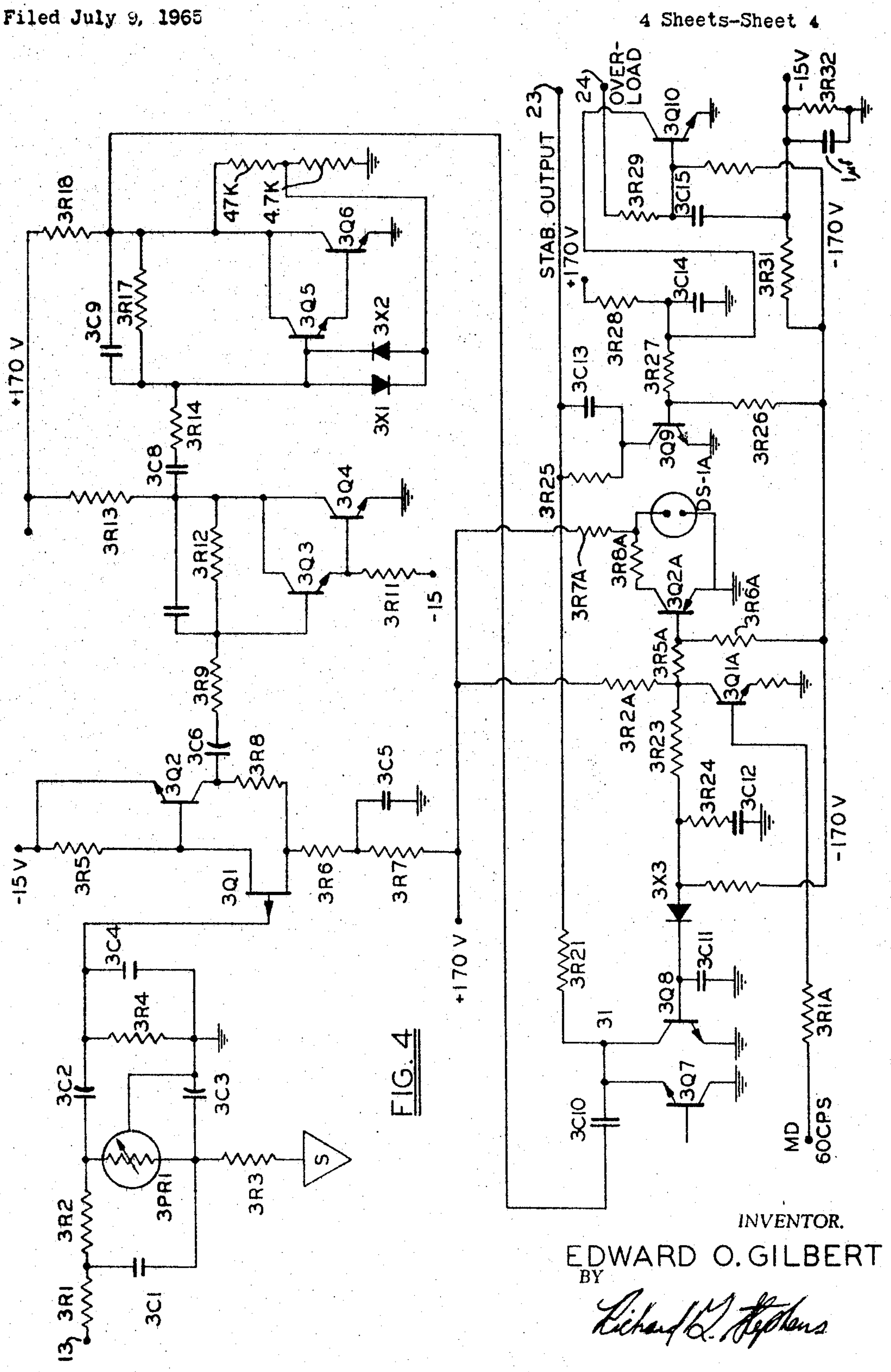

FIG. 2*a* is a schematic showing a unique power supply arrangement which may be used to supply power to a differential amplifier included within FIG. 2;

FIG. 3 is an electrical schematic showing the output stages portion of channel 20 of FIG. 1;

FIG. 4 is an electrical schematic diagram showing the stabilizer channel shown as a simple block 21 in FIG. 1.

In the illustrative embodiment of the invention shown in FIGS. 1–4, input voltages are applied at terminals 10 and 12 (see FIG. 1) to provide input signal currents via scaling resistors R1 and R2 to summing junction 11, and an input current $i_3$ may be connected directly to summing junction 11. A feedback current is applied to summing junction 11 via a feedback impedance shown as comprising resistor R–F.

The high-frequency channel of the dual channel amplifier is shown as a simple block 20 in FIG. 1, and comprises a preamplifier or input portion shown in detail in FIG. 2 and an output portion shown in FIG. 3. The signal at summing junction 11 is coupled through a roll-off network shown as comprising capacitors C1, C2 and resistor R1*a*, and past two oppositely poled pairs of series diodes X1 through X4 to input terminal 13 of the high frequency channel 20. Use of the roll-off network at the input stage allows the use of stages having greater gain inside amplifier channel 20, and allows the amplifier to handle input signals having higher velocities (rates of change). Diodes X1 to X4, which are largely optional, may be used to protect transistors within channel 20 from damage if high voltages accidently appear on the summing junction. The signal at terminal 13 comprises the input signal to high frequency channel 20 (see FIG. 2) and the input signal to stabilizer channel 21 (see FIG. 4).

The stabilizer channel includes a modulator, a plurality of AC-coupled stages, and a demodulator, and the low and zero frequency components of the summing junction signal are amplified in channel 21 to provide an input on line 23 to a differential amplifier within high frequency channel 20. As will be shown in detail in connection with FIG. 2, channel 20 includes a unique overload detecting circuit which detects the occurrence of an overvoltage condition in the amplifier system and rapidly provides an overload signal. The overload signal is provided in line 24 in FIG. 1. The overload signal is applied to control switching means within stabilizer channel 21 to alter the channel time-constant and provide a system oscillation, as will be described in detail below. The overload signal also is connected to illuminate a neon visual overload indicator DS1, and via an overload bus (not shown) to operate selected logic controls if computer mode-switching or other control is desired upon the occurrence of an overload. As will become evident, the overload signal on line 24 occurs substantially instantaneously when an overload occurs, without the time delay characteristic of most prior art overload detection schemes, and hence the overload signal on line 24 is ideally suited for implementing various of the overload control arrangements shown in application Ser. No. 404,895, filed Oct. 19, 1964, by Fogarty and Howe, and assigned to the same assignee as the present invention.

Referring now to FIG. 2, which shows the input end of high frequency amplifier channel 20, the input signal on terminal 13 is applied via blocking capacitor 1C2 and resistor R2 to the gate terminal of field effect transistor Q1. Resistor R1 and small capacitor C1 provide shaping of the gain-versus-frequency characteristics of the amplifier for stability purposes. The relatively large blocking capacitor 1C2 and large resistor R2 will be seen to have a fairly long discharge time-constant, which becomes significant insofar as recovery from an overload is concerned.

Transistors Q2 and Q3 will be seen to be connected through common impedances (R6, R7) to form a differential amplifier which is rather conventional except for the provision of a field effect transistor in each input circuit to the differential amplifier. Field effect transistor Q1 has its gate lead connected to blocking capacitor 1C2, its drain lead connected to the common impedance, and its source lead connected through resistor R3 to a power source. Transistor Q1 acts like a pentode vacuum tube or constant current generator, so that a very high input impedance is presented to the blocking capacitor, and a low impedance seen by the input circuit of transistor Q2. Field effect transistor Q4 similarly presents a very high impedance to terminal 23 and a low source impedance to transistor Q3. As well as providing very effective impedance matching, field effect transistors are ideally used in the differential amplifier section, early in the amplifier system, because of their excellent low-noise properties. The output signal on the Q3 transistor collector is applied to an emitter follower transistor Q5, which provides current gain. A small capacitor C3 from terminal 14 to the Q3 emitter provides a small amount of feed forward to enhance the handling of high frequency input signals.

The output signal from emitter follower Q5 is applied in succession to two Darlington pairs including transistors Q6 and Q7 in one pair, and Q8 and Q9 in the other pair. Each pair provides a considerable amount of current gain. Each pair includes local negative feedback to make its gain characteristic tend to be independent of changes in transistor characteristics. The local negative feedback paths around the first pair include resistor R17, capacitor C7 and series resistor-capacitor R16, C6. The output signal from the collector of Q7 of the first Darlington pair is applied via resistor R21 to the base of transistor Q8 of the second pair. The output signal from the collector of transistor Q9 present on terminal 26 is applied to a unique output circuit to be explained in detail in connection with FIG. 3, and also applied, as will now be explained to provide the fast overload signal on line 24.

During normal computer "not overloaded" operation, the voltage on line 26 varies between approximately 20–60 volts, and transistors Q10, Q11 and Q12 are all normally biased on. The current drawn by Q9 through resistors R27 and R28 biases on Q12. If an overload causes the Q9 collector to be driven toward an extreme in one direction, i.e., into saturation, so that the Q9 collector voltage falls toward zero, the base input signal to transistor Q10 will be seen to go negatively, eventually to the point where normally conducting Q10 will be shut off, thereby shutting off transistor Q11. If instead, an overload causes the Q9 collector to be driven toward an extreme in the opposite direction, i.e., toward cutoff of transistor Q9, the change in voltage drop across R28 will turn off transistor Q12, thereby turning off transistor Q11. Thus it will be seen that an overload in either direction will turn off transistor Q11. Resistors R35, R32 and R28 are selected so that the Q11 collector normally lies near zero volts with Q11 conducting in the absence of an overload. When an overload cuts off transistor Q11, the voltage on line 24 rises to approximately 100 volts. It is a feature of the overload circuit that the overload signal is "absolute" in nature, i.e., it goes in the same direction upon the occurrence of an overload irrespective of the direction of the overload. Such an absolute value signal is highly desirable for use in control switching, and is attained automatically in FIG. 2, while prior devices required an additional inverter and further logic circuitry to provide such absolute value overload signals.

It may be noted that transistors Q10, Q11 and Q12 are all direct-coupled to the Q9 collector without any long time-constant circuitry, and hence the overload signal on line 24 appears substantially instantaneously upon the occurrence of an overload. A lead network comprising capacitor C11 and resistor R29 constitutes a speedup circuit which accelerates switching when the overload is in a direction to drive Q9 toward saturation.

Rather than utilizing a conventional balancing circuit, the present invention provides an advantageous current-adjusting circuit which allows the amplifiers in a computer to be balanced much more rapidly. As shown in FIG. 2, adjustment of balance potentiometer R–B adjusts the amount of a balance current, which is applied together with the stabilizer channel output signal on line 23, in a long time-constant circuit, to the gate lead of transistor Q4 of the differential amplifier. In most prior stabilized amplifiers, balance controls varied plate resistance in one tube of a differential amplifier, and any adjustment of the control caused a step change in the DC system which frequently caused stabilizer system oscillation, so that balancing the many amplifiers in a large computer required much waiting for such oscillations to die down. In the present invention, a step change in balance potentiometer setting results in a step change in the current applied to capacitors C4 and 3C13 shown in FIG. 4, but only a ramp change in the input signal applied to the differential amplifier, so that no stabilizer system oscillation results.

It wil be seen that the differential amplifier is operated from a plus 11.8 volt supply and a −39.0 volt supply. In order that power supply variations cause minimum offset error in the differential amplifier, a unique power supply arrangement shown in FIG. 2*a* is utilized. The +11.8 volt supply will be seen to be derived from a voltage divider which includes resistor R1B, Zener diode VR1 and diodes X1B, X2B and X3B. The −39.0 volt supply will be seen to be derived by amplifying and inverting the +11.8 volt supply by means of transistor Q1B and feeding the −39.0 volt supply terminal through emitter follower Q2B. If the 11.8 volt supply varies for any reason so will the −39.0 volt supply vary, thereby minimizing any error due to offset in the differential amplifier. Diodes X1B, X2B and X3B have a temperature coefficient which varies the relationship between the +11.8 and −39.0 volt supplies with temperature, in order that the temperature coefficient of base to emitter junction potentials in transistors Q5, Q6, and Q7 may be compensated by opposite signed effect in the differential stage. The result is a very low temperature coefficient for the preamplifier.

The remainder of the high frequency amplifier channel, which includes a unique output stage, is shown in detail in FIG. 3. The signal on line 26 from the preamplifier is direct-coupled via resistor 2R1 to emitter-follower transistor 2Q2, and then to a further emitter follower 2Q3, both of the emitter followers acting as impedance buffers to present a high impedance to the preamplifier section and a low impedance to the output stage to be described. The quiescent voltage on line 26 lies at approximately +40 volts. Transistor 2Q1 is connected to operate as a constant-current generator to apply current through resistor 2R1, dropping the voltage at the base of transistor 2Q2 to about −155 volts. Most of this voltage is dropped across resistor 2R5, and hence transistor 2Q2 need not have a high voltage rating. Resistor 2R4 and capacitor 2C2 provide conventional decoupling. The output voltage from the 2Q2 emitter is applied to the 2Q3 base. The 2Q3 transistor comprises a further emitter follower using a high voltage rating transistor. The output signal on line 28 is applied to the amplifier output stage. Capacitors 2C6, 2C7 and resistor 2R21 provide shaping.

The amplifier output stage comprises a "cascode" transistor configuration which draws a modest idle current yet allows fairly heavy loads to be driven in either direction, together with unique current-limiting protection which makes fuses unnecessary to protect the amplifier. Most prior art computer transistor amplifiers incorporate fuses to prevent amplifier damage if the amplifier output terminal is incorrectly patched to a voltage source. Replacement of the fuses can be irksome and time-consuming.

In the circuit of FIG. 3, transistors 2Q5 and 2Q4 are connected in a cascode-like arrangement to allow heavy loads in either direction. Transistors 2Q4 and 2Q5 form a basic output stage which is the transistor equivalent of the vacuum tube "cascode" output stage shown and described at pp. 91–94 of "Design Fundamentals of Analog Computer Components" by R. M. Howe (D. Van Nostrand, New York, 1961). When the output signal on line 30 is very negative, transistor 2Q5 operates as a common emitter stage in which the amplifier load (connected to line 30 and not shown) is the main transistor load resistance, and the load current flows to the negative power supply. With output terminal 30, the 2Q5 collector negative, and sufficient load current through 2R12 the transistor 2Q4 base, which is connected to the 2Q5 collector through series diodes 2X1, 2X2 and 2X3, is also negative relative to its emitter, and transistor 2Q4 is cut off. Diode 2X5 clamps the 2Q4 base to prevent it from going too far negative, both to protect the transistor and to prevent delay due to recovery from an overbiased condition. When the output signal on line 30 is very positive, transistor 2Q4 acts as an emitter follower, and load current flows from the positive supply source through 2Q4 to terminal 30 and the external load (not shown), with the base drive input to transistor 2Q4 coming from the 2Q5 collector through diodes 2X1, 2X2 and 2X3. Feedback through resistor 2R10 tends to make circuit operation independent of transistor characteristics, such feedback generally having been unnecessary in vacuum tube cascode output stages.

When a heavy load is required with a negative output voltage, the current flowing through 2Q5 is sensed by sensing the voltage across a small series resistor 2R18 and applying that voltage via a low-pass filter (2C4 and 2R17) to control transistor 2Q7. If current begins to exceed a limit amount, transistor 2Q7 diverts input current on line 28, thereby preventing any increased amount of current from being drawn through 2Q5. The low-pass filter delays operation of transistor 2Q7 to allow a momentary peak current which is frequently required when driving a capacitive load. For example, a load of 200 ma. might be tolerated for perhaps 200 microseconds, while a steady load might not be allowed to exceed 40 milliamperes, for example. Because of the gain in transistors 2Q7 and 2Q5, the limiting characteristic provided by the transistor 2Q7 circuit may be made quite flat.

The current through transistor 2Q4 during positive outputs is sensed by resistor 2R15 and applied via a low-pass filter (2R14, 2C3) to control transistor 2Q6, which similarly diverts base current from 2Q4 to limit the current through 2Q4. In both limiter circuits, the current limit point is advantageously varied as a function of the voltage across the transistor being limited, so that each transistor is, in effect, power limited. Resistor 2R16 varies the limit point of transistor 2Q7 as a function of the voltage across power transistor 2Q5, and resistor 2R13 similarly varies the limit point of transistor 2Q4 as a function of the voltage across power transistor 2Q4.

Referring now to the stabilizer channel 21 shown in detail in FIG. 4, the signal on input terminal 13 is applied via a low-pass filter which includes resistance 3R1 and 3C1 which provide a fairly long time-constant. The voltage from the low-pass filter is applied to a voltage divider comprising resistance 3R2 and photoresistor 3PR1. The resistance of photoresistor 3PR1 varies between approximately 20K and many megohms as chopped light is applied to it, thereby applying a modulated input signal via capacitor 3C2 which is developed across resistor 3R4 and applied to the gate lead of field-effect transistor 3Q1.

The conventional ground symbol utilized throughout this disclosure represents the usual computer "power" ground. It is important to note that a connection is made between power ground and the "signal" ground of the computer through a low-pass filter comprising capacitor 3C3 and resistor 3R3. The use of such a low-pass filter is important in reducing noise in large computer systems containing long signal-ground and power-ground busses. By use of the series resistor 3R3 between the signal ground and the chopper ground point and the large capacitor 3C3 between the chopper ground point and power ground, the chopper and input capacitor 3C1 are tied to power ground in an AC sense at any reasonable noise frequency (e.g., 60 c.p.s. or higher), but a DC reference path still exists to signal ground through resistor 3R3.

Field effect transistor 3Q1 operates in pentode fashion, applying an input signal to the base of common-emitter stage 3Q2. Local negative feedback through resistor 3R8 renders the circuit gain relatively independent of changes in 3Q1 and 3Q2 and dependent substantially solely upon the ratio between 3R8 and 3R6. Resistor 3R7 and 3R5 provide operating bias for 3Q1. The output signal on the 3Q2 collector is AC-coupled via capacitor 3C6 and resistor 3R9 to two cascaded Darlington pairs comprising transistor pairs 3Q3–3Q4 and 3Q5–3Q6. A portion of the amplified output from transistor 3Q6 is applied to a diode feedback limiter circuit including diodes 3X1 and 3X2, so that the collector voltage excursions of transistor 3Q6 will be limited upon the occurrence of any overload. The 3Q6 collector output signal is capacitively coupled via 3C10 to a demodulator circuit comprising transistor 3Q8.

A 60 c.p.s. signal applied at terminal MD is applied to switch transistor 3Q1A on and off, and the 3Q1A collector voltage in turn switches transistor 3Q2A on and off. Switching 3Q2A on and off will be seen to switch neon bulb DS1A off and on. Bulb DS1A is located adjacent photoresistor 3PR1 mentioned above, thereby applying chopped light to the photoresistor. The 3Q1A collector voltage is applied via resistor 3R23 and diode 3X3 to switch demodulator transistor 3Q8 on and off, thereby connecting and disconnecting terminal 31 to and from ground at the modulation frequency. The demodulator output signal on terminal 31 is applied to the stabilizer output terminal 23 and to a very special low-pass filter comprised principally of resistor 3R21 and a relatively large capacitor 3C13. As shown in FIG. 2, capacitor 1C4 (.2 $\mu$f.) is connected from the stabilizer output line 23 to ground. It should be noted that capacitor 3C13 is connected to ground through switching transistor 3Q9. Thus during normal operation, the low-pass filter connected to the stabilizer demodulator comprises large capacitor 3C13 in parallel with somewhat smaller capacitor 1C4. During normal operation of the amplifier, transistor 3Q9 is saturated, so that capacitor 3C13 is grounded, and the stabilizer filter includes capacitors 3C13 and 1C4 essentially in parallel. During normal operation, the voltage divider comprised of resistors 3R28, 3R27 and 3R26 holds the base of 3Q9 positive so that 3Q9 is turned on. The junction between 3R27 and 3R28 lies at approximately 15 volts, so that 15 volts is stored across capacitor 3C14. In the absence of an overload signal on line 24 (i.e., with line 24 at approximately zero volt), transistor 3Q10 is cut off.

As soon as an overload signal appears on line 24, it is direct-coupled via resistor 3R29 to the base of transistor 3Q10, instantly turning on 3Q10. Turning on of transistor 3Q10 immediately discharges capacitor 3C14 and immediately reduces the voltage at the junction between 3R27 and 3R28, so that transistor 3Q9 is suddenly (and very rapidly) cut off. A feature of the invention is that occurrence of an overload lifts capacitor 3C13 from ground very rapidly, so that capacitor 3C13 cannot become charged to a very high voltage.

Eventually, when the fault which caused the overload is removed, the voltage on line 26 immediately falls to within limits, and the overload control voltage on line 24 immediately falls to zero. When that occurs transistor 3Q10 is driven into cut off allowing capacitor 3C14 to charge through 3R28. In the order of 0.7 second the voltage on 3C14 is sufficiently positive to turn on 3Q9 which then connects 3C13 to ground.

During the approximately 0.7 sec. period after removal of the fault but before transistor 3Q9 is re-closed, the isolation of capacitor 3C13 from the stabilizer channel 21 time-constant greatly reduces said time-constant, thereby causing the stabilizer loop to oscillate. Disconnection of relatively-large capacitor 3C13 from the stabilizer filter, leaving only smaller capacitor 1C4 will be seen to drastically reduce the stabilizer loop time-constant. It is a feature of the invention that the occurrence of the overload signal causes the stabilizer system to oscillate, at a frequency markedly higher than those frequencies normally associated with the stabilizer channel. When an overload occurs, it should be noted that the DC path around the amplifier loop is not opened or impaired or disabled by an overload, and the continued presence of such a DC path enables the amplifier system to drive itself out of an overload condition as it oscillates. The illustrative embodiment oscillates at a frequency of approximately 10 c.p.s. when capacitor 3C13 is disconnected. Oscillation of the amplifier DC loop at such a frequency rapidly reduces to small values the voltages to which any overload may have charged any of several long time-constant circuits, including the input blocking capacitor 1C2 circuit of FIG. 2 and each long-time-constant circuit associated wiht the stabilizer channel of FIG. 4. The 0.7 second oscillation period is terminated when transistor 3Q9 again re-connects capacitor 3C13, rendering the loop stable, and the amplifier is immediately ready for proper operation. As mentioned above, disconnection of capacitor 3C13 occurs very rapidly upon occurrence of an overload, so that capacitor 3C13 is disconnected before it can be charged up by an overload-level voltage. At the end of the 0.7 second oscillation period, some small voltage may exist across smaller capacitor 1C4 (FIG. 2) permanently connected to stabilizer output line 23. Reconnection of the uncharged larger capacitor in parallel with 1C4 at the end of the oscillation period will be seen to reduce the voltage across 1C4 to a very small value.

The capacitor 3C14 in conjunction with 3R28 does not allow the above described action if overload occurs for several milliseconds or less. In such time intervals the voltage on the relatively large capacitors associated with the normal stabilizing action cannot be charged significantly so no harm results. If 3C14 was not present each short overload of several millisecond period would start a 0.7 second stabilizer oscillation as described above. Since this is obviously not necessary, 3C14 is included.

While specific values and devices are shown, they are in no means restrictive and values and devices may be varied widely by those skilled in the art. Thus the design uses silicon diodes and transistors, but germanium or other semiconductor devices are also applicable as are vacuum tubes.

Many circuit changes are also possible within the features of the present design. The number and nature of intermediate stages and the frequency response shaping networks may vary widely with no fundamental change. The means for switching from stable to unstable circuit conditions can take different forms. For example, the value of 3R21 could be switched to a low resistance value to cause a time constant reduction to achieve the oscillating condition. Similar oscillating conditions would be obtained by varying stabilizer gain or the RC circuit composed of C2 and R2 in FIG. 2. These methods and others would be controlled by the fast overload circuit and timing circuits similar to the embodiment shown.

It will be apparent that most of the features of the present invention are as applicable to vacuum tube amplifiers as to the transistorized embodiment shown.

I claim:

1. In an amplifier operable to receive an input current at an input terminal and to provide an output voltage at an output terminal and wherein said amplifier comprises a plurality of cascaded amplifying stages direct-coupled to each other including a first amplifying stage having a first input circuit connected to said input terminal and a second input circuit connected to a third terminal and said plurality of cascaded amplifying stages includes a last amplifying stage having an output circuit connected to said output terminal, first circuit means for applying an input current to said input terminal, second circuit means for connecting a feedback impedance between said output terminal and said input terminal, a drift-stabilizer amplifier channel having an input circuit connected to said input terminal and an output circuit connected to apply a drift-rebalancing signal to said third terminal, whereby said drift-stabilizer amplifier channel, the portion of said amplifier between said third terminal and said output terminal, and said feedback impedance are connected in a closed-loop circuit, said closed-loop circuit having a loop gain and phase shift relationship selected so that said closed-loop circuit is nonoscillatory when connected in a first circuit configuration, said closed-loop circuit including at least one low-pass filter having a capacitor which becomes charged to an abnormal voltage when an overload is applied to said amplifier and said abnormal voltage tends to prevent proper operation of said amplifier, the combination of switching means operable to re-connect said closed-loop circuit from said first circuit configuration to a second circuit configuration having a different loop gain-phase shift relationship selected so that said closed-loop circuit will be oscillatory upon removal of said overload when connected in said second circuit configuration, and third circuit means responsive to the output voltage of one of said cascaded amplifying stages other than said last amplifying stage for operating said switching means to re-connect said closed-loop circuit to said second circuit configuration when the output voltage of said one of said cascaded amplifying stages exceeds a predetermined level, whereby upon removal of said overload said closed-loop circuit will oscillate and said abnormal voltage will decrease.

2. The combination according to claim 1 in which said input circuit of said drift-stabilizer amplifier channel comprises modulator means connected to modulate the voltage at said input terminal, amplifying means connected to amplify the modulated voltage supplied by said modulator means, demodulator means connected to demodulate the amplified voltage supplied by said amplifying means, and said low-pass filter, said low-pass filter being connected to filter the output signal from said demodulator means to provide said drift-rebalancing signal.

3. The combination according to claim 1 in which said switching means is connected to alter the time-constant of said low-pass filter to provide said second circuit configuration of said closed-loop circuit.

4. The combination according to claim 1 in which said first input circuit of said first amplifying stage includes a current-blocking capacitor.

5. The combination according to claim 1 in which said third circuit means includes time-delay means to delay reconnection of said closed-loop circuit to said first circuit configuration after said output voltage of said one of said amplifying stages decreases below said predetermined level.

6. The combination according to claim 1 in which said third circuit means includes time-delay means to delay operation of said switching until after said output voltage of said one of said cascaded amplifying stages has exceeded said predetermined level for a predetermined length of time.

7. The combination according to claim 1 having indicating circuit means responsive to said output voltage of said one of said cascaded amplifying stages for providing an overload indicating signal.

8. The combination according to claim 2 in which said low-pass filter includes first and second capacitor means connected during said first circuit configuration to become charged in accordance with said output signal from said demodulator means, and in which said switching means is operable to disconnect said second capacitor means to prevent said second capacitor means from being charged during the occurrence of said second circuit configuration.

References Cited

UNITED STATES PATENTS

| | | | |
|---|---|---|---|
| 3,070,762 | 12/1962 | Evans | 333—70 |
| 3,147,446 | 9/1964 | Wittenberg | 330—9 |
| 3,161,045 | 12/1964 | Ames, Jr. | 73—88.5 |
| 3,222,607 | 12/1965 | Patmore | 330—9 |
| 3,237,117 | 2/1966 | Collings et al. | 330—9 |
| 3,286,189 | 11/1966 | Mitchell et al. | 330—18 |

NATHAN KAUFMAN, Primary Examiner

U.S. Cl. X.R.

330—11, 17, 20, 24